United States Patent [19]

Friedrich et al.

[11] Patent Number: 5,051,339

[45] Date of Patent: Sep. 24, 1991

[54] METHOD AND APPARATUS FOR APPLYING SOLDER TO PRINTED WIRING BOARDS BY IMMERSION

[76] Inventors: Dieter Friedrich; Gitta Friedrich, both of AM Kressenstein 48, D-8500 Nurnberg 90, Fed. Rep. of Germany

[21] Appl. No.: 330,563

[22] Filed: Mar. 29, 1989

[30] Foreign Application Priority Data

Mar. 29, 1988 [DE] Fed. Rep. of Germany ....... 3810653

[51] Int. Cl.$^5$ .......................... B05D 5/12; G03C 5/00
[52] U.S. Cl. .................................... 430/311; 430/313; 427/96; 427/97; 427/98; 427/99; 427/126.1; 264/104
[58] Field of Search .................. 430/311, 313; 427/96, 427/97, 98, 99, 126.1; 264/104

[56] References Cited

U.S. PATENT DOCUMENTS 4,234,631 11/1980 Davis ..................................... 427/98
4,804,615 2/1989 Larson et al. .......................... 427/98

FOREIGN PATENT DOCUMENTS 8602631 5/1986 Fed. Rep. of Germany .
3724005 2/1989 Fed. Rep. of Germany .

Primary Examiner—Charles L. Bowers, Jr.
Assistant Examiner—Ashley I. Pezzner
Attorney, Agent, or Firm—Browdy and Neimark

[57] ABSTRACT

A method for the immersion application of solder to printed wiring boards, including the steps of producing a printed wiring board with electrically conductive regions, which are to be provided with a solder deposit, surrounding the regions with a limiting layer of defined layer thickness for preventing an application of solder, which thickness substantially corresponds to the height of the solder deposit to be produced thus forming voids, immersing the thus-prepared printing wiring board into a soldering bath containing a suitable soldering alloy, covering the voids, filled in the soldering bath with liquid solder and located above the regions to which solder is to be appled, with at least one closure element at a defined contact pressure, removing the covered printed wiring board from the soldering bath, dropping the temperature of the solder trapped in the voids below the setting temperature of the solder alloy, removing the closure element, and optionally, removing the limiting layer. An apparatus for accomplishing the aforesaid method is also provided.

17 Claims, 7 Drawing Sheets

METHOD AND APPARATUS FOR APPLYING SOLDER TO PRINTED WIRING BOARDS BY IMMERSION

BACKGROUND OF THE INVENTION

1. Field of the Invention

The invention relates to a method for applying solder to printed wiring boards by immersion. The invention also relates to an apparatus for applying solder to printed wiring boards by immersion, having a limiting layer laterally defining the solder deposit, having a retaining device, to which a printed wiring board, prepared for the immersion application of solder, can be attached, a transport device, with which the retaining device is movable with a vertical and/or horizontal component, and a solder container having liquid solder, into which container the retaining device equipped with a printed wiring board can be introduced.

2. The Prior Art

Various methods have become known for applying solder regionally to printed wiring boards in such a way that following the assembly of the boards with SMD components (surface mounted devices), the boards can be electrically and mechanically connected to the components by reflow soldering methods. Details of the reflow soldering method are found for instance in German Patent Application P 37 24 005. In particular, the prior art uses a method in which the solder deposit is applied to the selected regions of the printed wiring board in the form of a deposit of solder by screen printing or mask printing with soldering pastes. In many aspects, this known method cannot be considered optimal. For instance, the investment cost for the screen printing machines, screens and masks required is quite considerable; the screens that must be used wear regularly; the entire screen printing process must be monitored continuously, because it cannot be precluded that the screens used may become plugged in some regions; and so-called thin solder spots are often produced, which can mean a low mechanical and thermal load capacity for the solder connections based on them. Moreover, soldering pastes are expensive, the resolution of the screen printing method is limited, and the optoelectronic positional recognition of assembly systems involves great difficulties, because of soldering paste deposits that do not properly match the intended contour, resulting in deviations in production. The flexibility of interlinked production lines having screen printing robots is greatly impaired, because screen printing machines entail considerable setup times and adjustment work. Moreover, the heating speed of the introduction of heat in reflow soldering with soldering pastes has proved to be limited, because in the heating process, vaporous ingredients and solvents from the soldering paste have to evaporate, which takes a certain amount of time.

A further frequently used method in the prior art is known as immersion application of solder to printed wiring boards; in this method, a prepared printed wiring board is dipped into and removed from a solder bath. After being removed and following a cooling down phase, the metallized regions of the printed wiring board provided with a solder resist means are provided with a solder deposit, which, however, has a more or less convex cross-sectional shape. The height of the solder deposit is also dependent on the dimensions (in the plane of the printed wiring board) of the regions to which solder is to be applied, so that when such regions have different dimensions, variably high solder deposits necessarily result (German Utility Model 86 02 631).

To compensate for this, this document also discloses levelling off the excessively high solder deposits by so-called hot air levelling, that is, the use of an aimed hot-air flow. However, a levelling process of this kind is very labor-intensive, making production more expensive.

SUMMARY OF THE INVENTION

It is the object of the invention to disclose an improved method for the application of solder to printed wiring boards by immersion, which, similarly to a screen printing method, results in a solder deposit of substantially rectangular cross-section in which the height of the deposit does not depend on the dimensions of the solder deposit faces, and which is relatively inexpensive, compared with the application of soldering pastes of the prior art, and makes it possible to deliver printed wiring boards with solder applied, which can then be used directly by the user, or optionally after a supplementary application of flux, even in complicated SMD assembly processes.

It is also an object of the invention to disclose an improved apparatus for the application of solder by immersion to printed wiring boards, in particular an apparatus for performing the method according to the invention.

This object is attained, in a method for the application of solder to printed wiring boards by immersion, by the combined total of the following method steps: production of a printed wiring board with electrically conductive regions (solder pads), which are to be provided with a solder deposit; surrounding of these regions with a limiting layer of defined layer thickness preventing an application of solder, which thickness substantially corresponds to the height of the solder deposit to be produced; immersion of the thus-prepared printing wiring board into a soldering bath containing a suitable soldering alloy; covering of the voids, filled in the soldering bath with liquid solder and located above the regions to which solder is to be applied, with at least one closure element at a defined contact pressure; removal of the covered printed wiring board from the soldering bath; dropping below the setting temperature of the solder alloy; removal of the closure element; and optionally, removal of the limiting layer.

Advantageous further features of the method according to the invention are disclosed in the dependent claims. The printed wiring boards with solder applied by immersion by the method according to the invention have the following advantages in particular.

The quality and above all the homogeneity of the soldered connections attainable are extraordinarily good, compared with the prior art methods, which can be ascribed to the fact that the method according to the invention avoids creating a deposit of soldering paste in the conventional sense, with its associated disadvantages such as bubble formation, oxidation of the soldering paste, fine granulation and the like.

Because of the immersion application of solder performed in accordance with the invention, solder deposits homogeneously shaped out on the board are in fact created with a virtually rectangular cross-section, and no foreign ingredients, that is, no ingredients but solder, are present in the solder deposits, which in the final analysis greatly improves the quality of the soldered connection.

Since the solder deposits are virtually a homogeneous continuum rather than a conglomerate of various ingredients as in the conventional soldering paste deposit, defects in the form of solder beading and bridging as well as the occurrence of short circuits are maximally avoided in the method according to the invention.

Further advantages in terms of layout, storage, more compact grid dimensions for processing integrated circuits or other connections, novel housing shapes and others will become apparent from the ensuing detailed description.

The method according to the invention first provides, in particular, the production of a printed wiring board with metallized regions which are to be provided with a solder deposit. A distinction should be made, for instance, between such regions that optionally are to be provided with a flat solder layer and those that are to be provided with a layer of relatively high solder size. The latter regions are used for the aforementioned SMD method and in accordance with the method are surrounded with a limiting layer of defined layer thickness, corresponding substantially to the height of the solder deposit to be produced, that prevents the application of solder in these regions.

The thus-prepared printed wiring board is immersed in a solder bath containing a suitable solder alloy, so that the voids located above the regions and laterally limited by the limiting layer fill up with the liquid solder. Next, in the solder bath, the printed wiring board is covered with the aid of suitable elements or devices in such a manner that when the circuit board is removed, the still-liquid tin remains completely inside the voids. To this end, a closure element is used, which, for instance, exerts a defined contact pressure, optionally with an elastic surface, upon the limiting layer of the printed wiring board. In this acted-upon or, in other words, closed state, the printed wiring board is removed from the solder bath; a cooling process follows, and optionally even an intensive quenching process, for instance, by means of a liquid bath in which the solder alloy drops below its setting temperature. Then the closure element is removed; in this connection it is significant that the surface of the closure element must be embodied such that it is not moistened by the solder. Otherwise, there would be the danger that upon removal of the closure element, the solder deposit would be torn away from its surface. To enable unimpeded application of the components the connections of which protrude not at all or insignificantly beyond the lower surface of the component body, it may be suitable to detach or wash off the limiting layer, which is either a photosensitive solder resist mask or a regionally applied foil layer. This step may be omitted, however, without departing from the scope of the invention, if components having connection leads that protrude downward beyond the component body are to be electrically connected to the SMD solder pads. The thickness of the limiting layer for advantageous performance of the method may preferably be between 10 $\mu$ and 350 $\mu$m.

If a photosensitive solder resist mask is used as the limiting layer, then preparation or "cutting out" from the limiting layer of the regions to be soldered can be accomplished relatively simply by exposing the limiting layer to a photographic master defining the SMD solder pads. After exposure to light, the printed wiring board is introduced into a bath that removes the exposed regions, for instance, washing them out. It may be advantageous, prior to the immersion of the printed wiring board, to apply a deposit of flux to the optionally not-yet pretinned SMD solder pads, to attain reliable moistening with the molten solder. It may also be advantageous to provide all the regions of the printed wiring board to which solder is to be applied, that is, the lands, plated through holes, SMD solder pads, and the like, with a primary application of solder. However, this must be done before the limiting layer is applied. This is because the limiting layer then in fact also covers the areas that are not provided with the solder deposits according to the method. In other words, only the SMD solder pads are not covered by the limiting layer.

Above the regions to which solder is to be applied by the method, the limiting layer produces relatively narrow voids, depending on the dimensions of these regions, so that the solder resist action of the limiting layer side edges can mean that the solder material will penetrate the narrow voids only very slowly or not at all. To counteract this negative effect of the negative capillary pressure, it is advantageous for the solder material to flow against the printed wiring board surface with additionally generated turbulence, shortly before immersion or in the immersion zone of the solder bath itself. Turbulence can be generated in quite various ways, for instance, by means of turbulence nozzles, which in the vicinity of the surface of the printed wiring board generate a flow of solder aimed at least partly at the surface; however, it is also possible to generate turbulence by moving the printed wiring board in the soldering bath itself. For instance, it would be conceivable to impart a vibrational motion of relatively high frequency to the printed wiring board in the bath, which would assure that even the smallest regions would be moistened. In principle, it is also possible to set the solder container itself into vibration for a brief period, in order to trigger the desired turbulence, if the size of the solder container permits this.

Further according to the present invention, it is provided that the printed wiring board is removed from the solder bath in a preferred manner between two moving revolving elements, at least one of which has a closure surface and serves as a closure element. The revolving motion of these elements may for instance be continuous or discontinuous, for instance, being switchable between different revolving speeds.

In a removal process of this kind, it is extremely favorable, if the printed wiring board is guided between the two revolving elements (for instance, conveyor belts) through successive zones of different temperatures; these zones define a printed wiring board conveyor path, as a result of which a quenching of the solder alloy in the voids that are located above the regions to which solder is to be applied takes place.

According to the present invention, heating of the lowermost zone immersed in the solder bath and cooling of one or more zones disposed preferably at the end of the printed wiring board conveyor path are provided.

Relatively very quick cooling of the printed wiring board after its removal from the solder bath with the attendant attainment of the quenching effect is extraordinarily desirable for metallurgical reasons, as will be explained in further detail hereinafter in the context of the description of the exemplary embodiments.

Further features of the method are provided by the following method steps: mounting of the printed wiring board with a side edge in an approximately vertical position on a gripper arm; immersion of the gripper arm provided with the printed wiring board into the soldering bath; delivery of the printed wiring board to an introduction region, which is embodied by the revolving elements embodied as conveyor belts substantially contacting one another; reception of the printed wiring board by the conveyor belts and removal from the gripper arm; transporting of the printed wiring board in between the two conveyor belts at a defined contact pressure; passage through the zones of different temperature to into the cooling zone; and ejection of the plate or printed wiring board, with solder completely applied, to a plate discharge region. Further, the board is delivered within the soldering bath to the entry region along a path of motion extending substantially parallel to the surface of the printed wiring board.

As mentioned above, the invention also relates to an apparatus for applying solder by immersion to printed wiring boards, as generically described in the above field of the invention. This apparatus substantially has a retaining device, which preferably comprises a material that is not wettable by the solder and to which a printed wiring board prepared for the immersion application of solder can be attached; a transport device is also provided, with which the retaining device, equipped with the board, is movable with a vertical and/or horizontal component, and furthermore a solder container is provided, which is filled with liquid solder and into which the retaining device, equipped with a printed wiring board, can be introduced.

To assure that in the removal process the liquid solder is firmly retained in the region defined by the limiting layer until it sets, at least one covering device is provided according to the invention for the apparatus; the covering device can be pressed in the solder container against the solder-moistened surface of the printed wiring board and in the clamped position can be removed together with the printed wiring board from the solder container.

It is necessary for the invention that the covering device not execute any substantial relative motion with respect to the surface of the printed wiring boards, so as to assure the necessary sealing action. To this end, it may be advantageous for the covering device to be joined to the retaining device by a hinge-like fastening. It is also suitable for the motion of the covering device to be generated by drive mechanisms controllable from outside the solder container; however, it is also possible for the clamping/closure motion of the covering device to be initiated by a mechanical element that is located inside the solder container, for instance, a protrusion that unlatches the catch of a spring catch device, so that a spring is the source of the closure motion.

As also explained above, it may also be suitable to generate turbulence, to undertake a relative motion between the printed wiring board and the bath, to which end the apparatus may for instance, have a motor drive on the retaining device, which drive provides a reciprocating motion of the printed wiring board in the solder bath. The motor drive may either move the entire retaining device back and forth or may be disposed on the retaining device in such a way that only the printed wiring board is moved. Preferably, this drive may be embodied by a vibrator.

In the context of an advantageous further feature of the apparatus according to the invention, the covering device may preferably be embodied as a conveyor belt on the surface of which the printed wiring board rests with a defined contact pressure and on which it is guided out of the solder bath.

In particular, this covering device may comprise two conveyor belts revolving contrary to one another and between them forming a receiving gap, for instance, of variable width, for the printed wiring board.

Further advantageous features of the apparatus according to the invention, in which the covering device is embodied by two conveyor belts, which each travel on one conveyor belt housing supporting the undersides of the belts. Zones of different temperatures may be formed in the respective conveyor belt housing. A retaining device may be provided which has a receiving device for substantially vertical retention of the printed wiring board from below and with which the printed wiring board can be introduced from below into an entry region between the two conveyor belts.

Still other objects, features and attendant advantages of the present invention will become apparent to those skilled in the art from a reading of the following detailed description of the embodiments constructed in accordance therewith, taken in conjunction with the accompanying drawings.

BRIEF DESCRIPTION OF THE DRAWINGS

The invention of the present application will now be described in more detail with reference to the preferred embodiments of the device, given only by way of example, and with reference to the accompanying drawings, in which.

DESCRIPTION OF THE PREFERRED EMBODIMENTS

Figure 1:
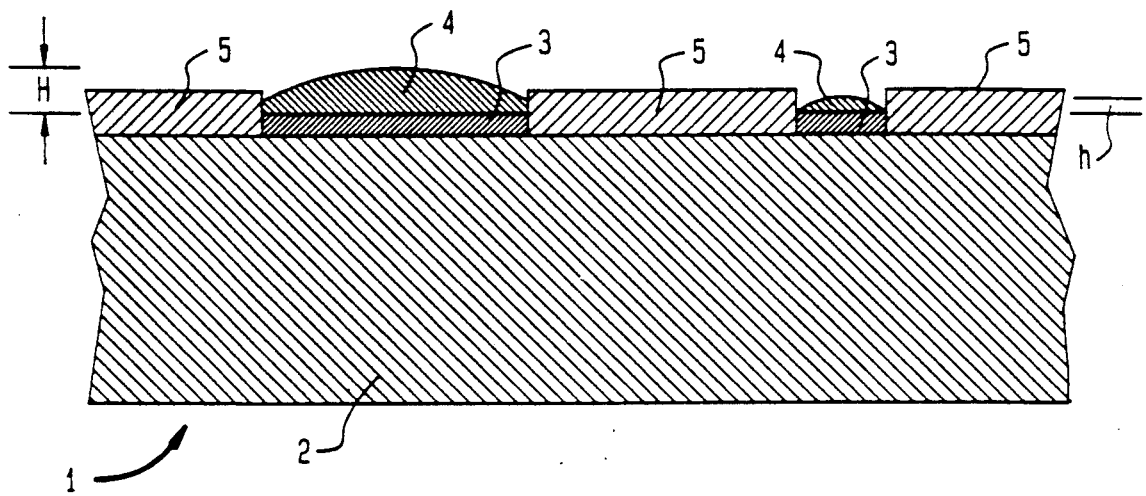
FIG. 1 is a section through a printed wiring board, to which solder has been applied by a conventional immersion solder application method of the prior art.

The printed wiring board 1 shown in section in FIGS. 1–5 substantially comprises a substrate 2 of a plate-like insulating material, on which conductive regions 3 are disposed, which are to be provided with a solder deposit 4. In the prior art, it was already usual to surround these regions 3 with a layer 5 that prevented the application of solder, which layer may for instance be embodied by a solder resist coating.

As can clearly be seen, the printed wiring boards 1 produced by an immersion solder application method according to the prior art have a solder deposit 4, on which a rounded surface forms because of the high surface tension of the solder. Moreover, it can clearly be seen that the height H of the solder deposit shown on the left differs from the height h of the solder deposit shown on the right. It must be noted that the prior art can be classified as one of two variants, namely a) the variant shown in FIG. 1 (immersion solder application without ensuing air levelling), and b) solder application by immersion with ensuing levelling (for instance, hot-air or oil methods); where in variant b) the solder deposit is made uniform, but at the same time is considerably reduced in thickness, for example to 10 μm. Variant b) is the method primarily used at present in printed wiring board technology for producing 10 lead SnPb coatings, which are readily solderable, on Lp solder sites. Variant a), however, is considered the closest prior art to the method according to the invention.

Figure 2:
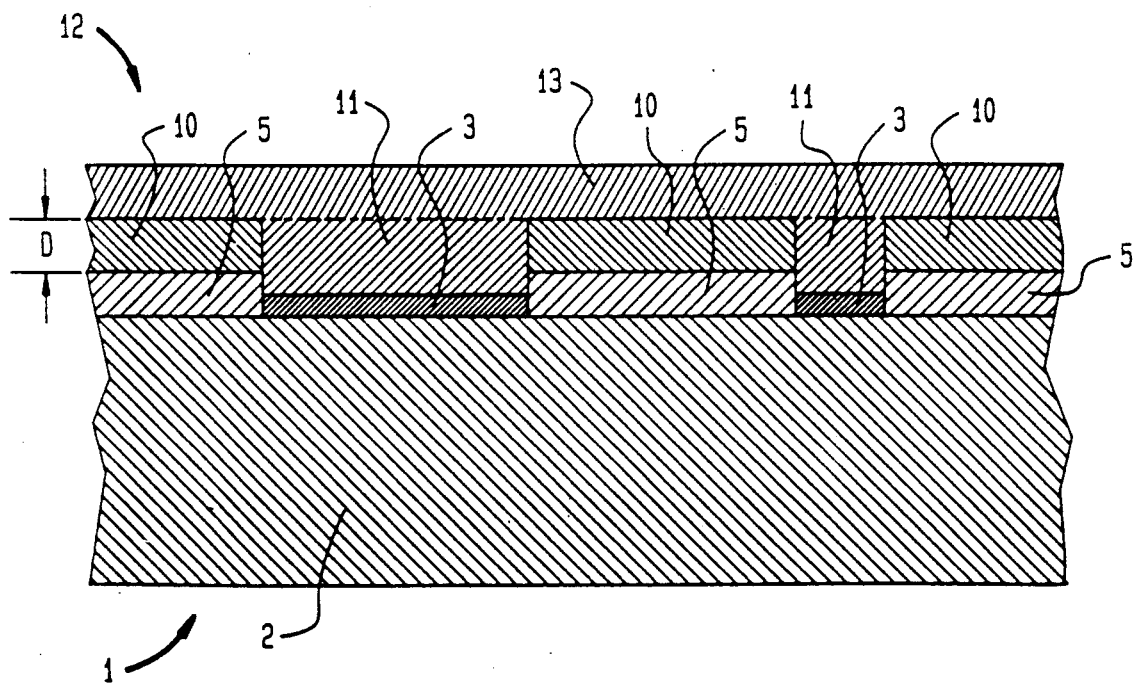
FIG. 2 is a section through a printed wiring board prepared in accordance with the invention and located in a solder bath.

FIG. 2 now shows a portion of the printed wiring board 1 of FIG. 1, which has a limiting layer 10 of defined layer thickness D on the layer portions 5 that hinders the application of solder; the layer thickness is approximately equivalent to the height of the solder deposit to be produced. Under some circumstances it may be possible for slight differences to arise because the regions 3 of conductive material have a somewhat slighter layer thickness than the first layer 5 surrounding them and onto which latter layer 5 the limiting layer is applied.

Above the regions 3, the limiting layer 10 forms voids 11, which are filled with liquid solder 13 in an immersion bath 12. On their bottoms, the voids 11 are defined by the regions 3, while at their side walls they are defined by the limiting layer 10 and/or optionally by the first layer 5 as well.

Figure 3:
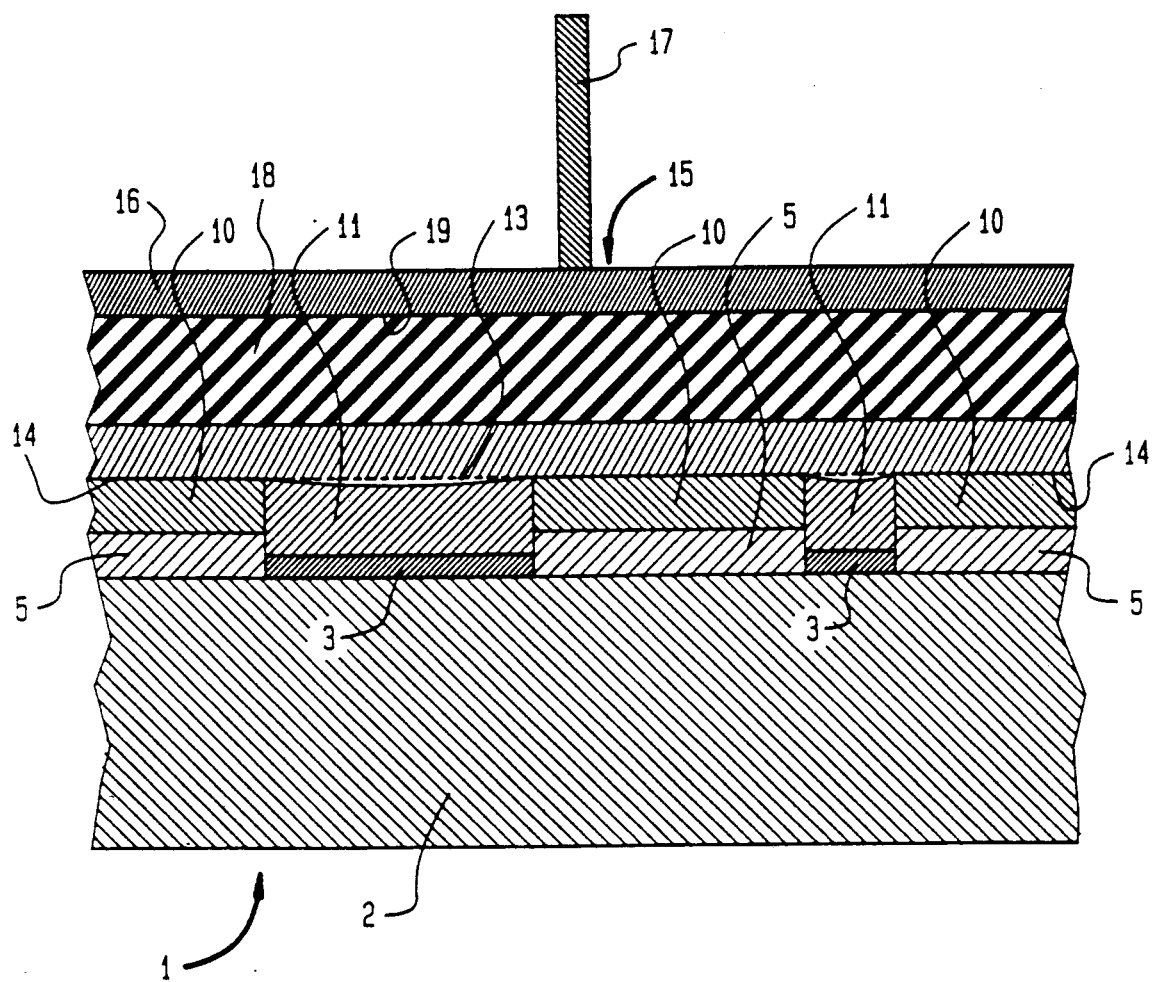
FIG. 3 is a section in accordance with FIG. 2 after the covering device has been placed upon the printed wiring board.

In the portion of a printed wiring board 1 shown in FIG. 3, the conditions shown in FIG. 2 again prevail, except that a closure element 15 is now pressed against the free surface 14 of the limiting layer 10. The closure element 15 comprises a plate 16, a guide element 17, and an elastic sealing layer 18, which is disposed between the flat side 19 of the plate 16 facing the printed wiring board 1 and the printed wiring board 1 itself. The face of the sealing layer 18 acting upon the free surface 14 curves inward somewhat into the voids 11 as a result of the contact or sealing pressure applied, so that the solder pad acted upon by the sealing layer 18 is somewhat concave, and once the entire assembly comprising the printed wiring board 1 and the sealing device 15 sealingly mounted on it has been removed from the solder bath, the solder pad when set still has a somewhat concave exposed surface.

Figure 4:
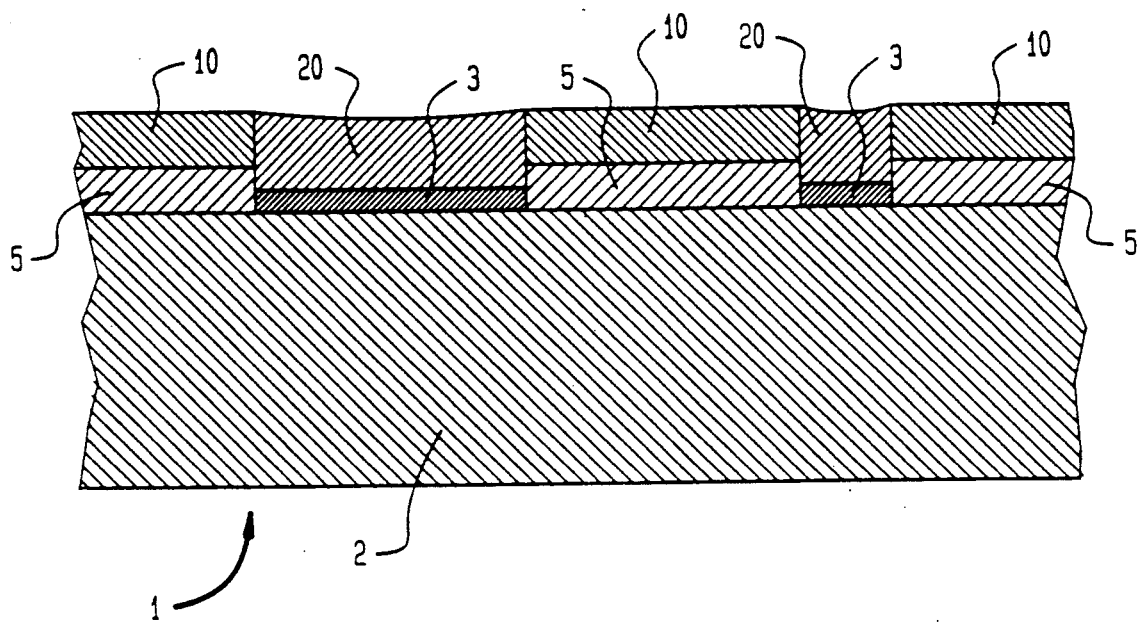
FIG. 4 is a section through a printed wiring board produced according to the method, after the removal of the covering device.
Figure 5:
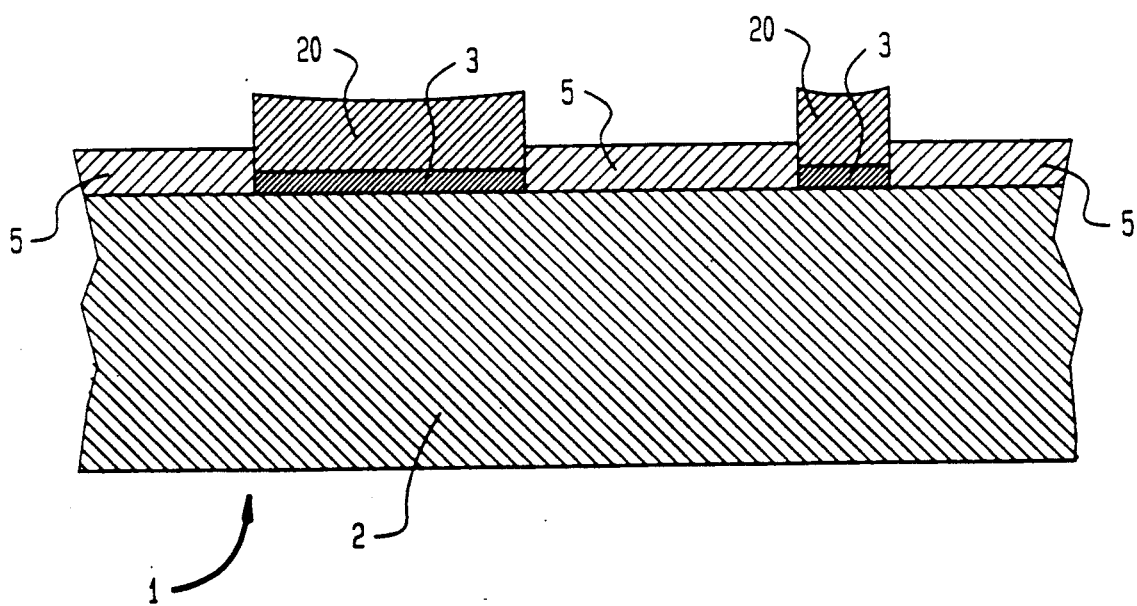
FIG. 5 is a section corresponding to FIG. 4 after the detachment of the limiting layer.

FIG. 4 shows a printed wiring board portion 1 corresponding to FIG. 3 but from which the covering device 15 has been removed; in the portion shown in FIG. 5, the solder layers 20 formed as the outcome of the method are shown.

Figure 6:
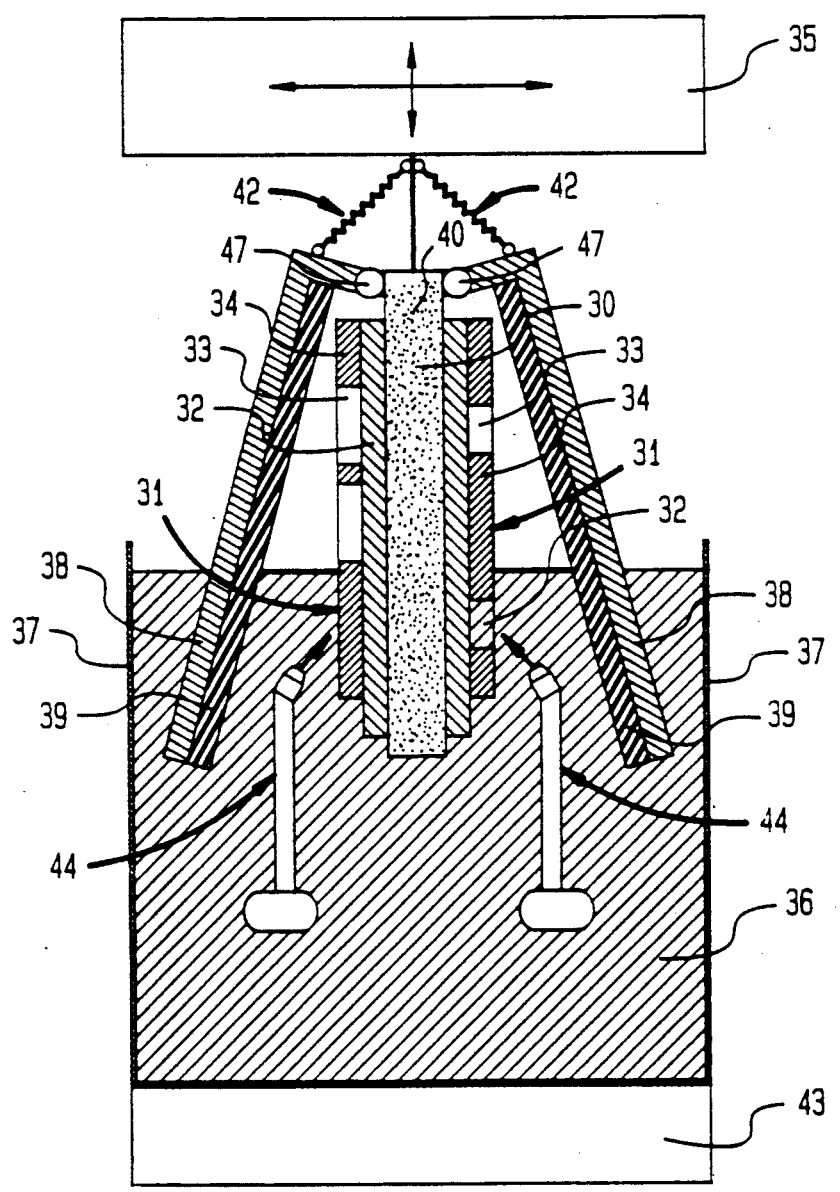
FIG. 6 is a schematic view of a retaining device, provided with a covering device, upon immersion into a solder bath.

In the exemplary embodiment schematically shown in FIG. 6, a retaining device 30 is provided on which two printed wiring boards 31 are disposed on both sides in such a way that the undersides of the substrates 32 rest on the retaining device 30, while contrarily the regions 33 intended for the application of solder, which are surrounded by limiting layers 34, are in the open. A retaining device to which more than two printed wiring boards could be attached would also be conceivable, and it is also conceivable to embody a retaining device such that a printed wiring board equipped with circuits on both sides (which is possible in principle for printed wiring boards prepared by the SMD method) could be secured to the retaining device and introduced into the solder bath. The retaining device is disposed on a transport device 35, shown only schematically, by which the retaining device equipped with the printed wiring board can be moved to above a solder container 36, immersed in it and removed from it, and optionally moved onward to the next processing station.

Covering devices 37 are disposed on the retaining device 30, each comprising one plate 38 and an elastic or non-elastic sealing layer 39. On the upper end, the plates 38 of the covering devices 37 are secured by means of hinges 41 to the retaining device 30.

In the open position shown in FIG. 6, the retaining device 30 equipped with the printed wiring boards 31 is immersed into the solder container 36 filled with liquid solder. Movable solder turbulence nozzles 44 are, for instance, disposed in the vicinity of the immersion zone, which generate a flow of solder aimed at least partly against the surfaces of the printed wiring boards 31, to assure moistening of even the smallest regions 33.

Figure 7:
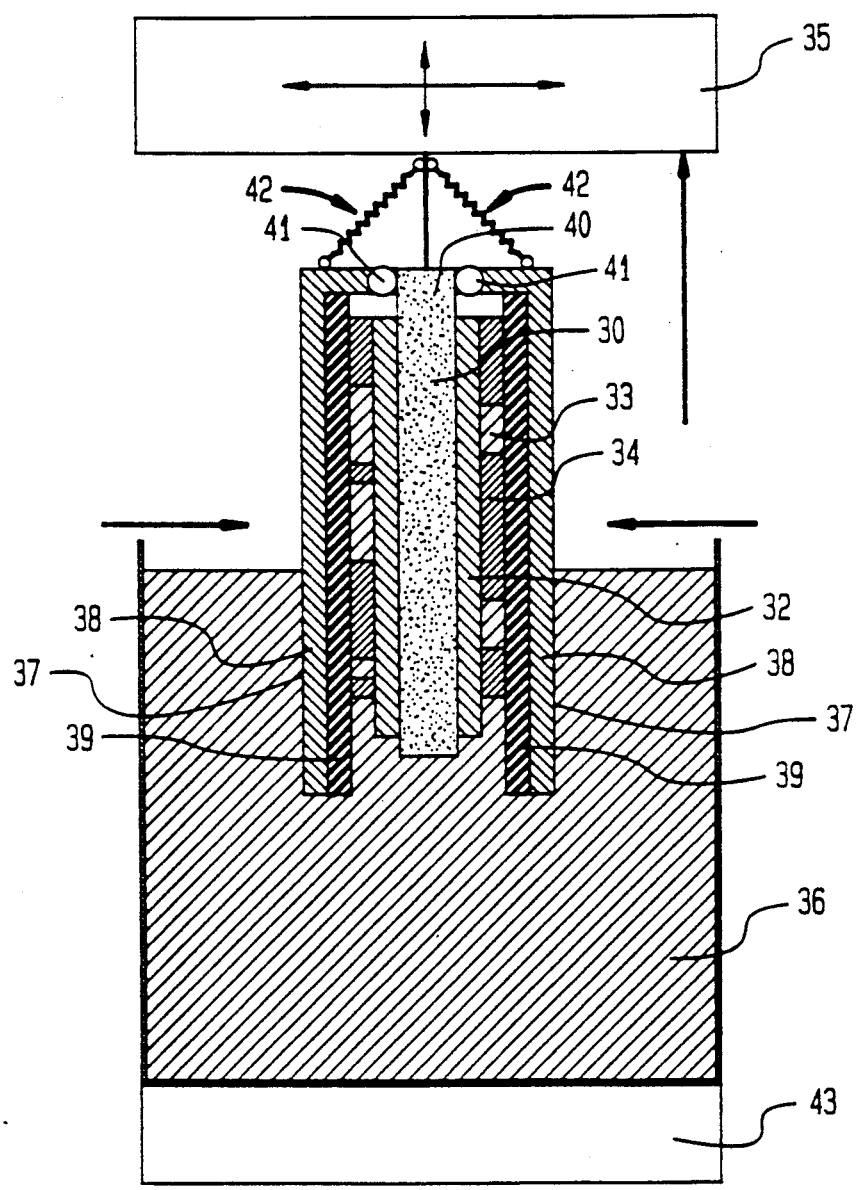
FIG. 7 is a schematic view of a retaining device, provided with a covering device, in a closed position upon removal from the solder bath.

As soon as the regions 33 intended for the application of solder are completely moistened in the solder bath, the covering devices 37 are closed, and the entire apparatus is removed again from the solder container 36, in the closed position shown in FIG. 7. As soon as the solder trapped in the voids 11 has dropped below its setting point, the covering devices 37 can be opened and the printed wiring boards 31 with solder applied can be removed. It is also possible by means of the transport device 35 to immerse the entire opened apparatus into a bath, in which the limiting layers 34 are washed off, so that the final product of the method is a printed wiring board as shown for example in FIG. 5.

In laboratory tests it has been found that it may be suitable to preheat the elements that are immersed in the solder bath (that is, the retaining device, substrate, covering device, plate, sealing layer and the like) before they are immersed into the solder bath (the preheating being performed to a temperature above the melting point of the solder or to the temperature of the solder bath itself), and that it may also be suitable to subject the entire assembly (including the printed wiring board) in the still-closed state after removal from the solder bath to an intensive cooling (for example by immersion into a water bath), in order to accelerate the course of setting and thereby prevent an overly pronounced growth of the intermetallic CuSn phases. For heating the aforementioned elements, it may be suitable to provide a heating device on the retaining device and/or on the covering device.

For the covering devices 37, drive means for performing the clamping/closure motion may be provided, represented here by compression springs 42. Other means are also conceivable, for instance, electromechanical, pneumatic, hydraulic or other such means. It is also within the scope of the invention to keep the covering devices firmly in an open position, biased by the compression springs 42, until such time as a detent device in the immersion process actuates a release device, which under the pressure of the springs 42 shifts the covering devices into the closure position shown in FIG. 7.

From FIGS. 6 and 7 it can also be seen that a vibrator 43 is disposed immediately below the solder container 36; by means of the vibrator, the retaining device 30 can be set into reciprocating motion inside the solder container 36, for instance, a vibrational motion of relatively high frequency, and by this means even the smallest regions on the printed wiring board are moistened. This provision may be in addition to or instead of the provision of solder turbulence nozzles 44.

Figure 8:
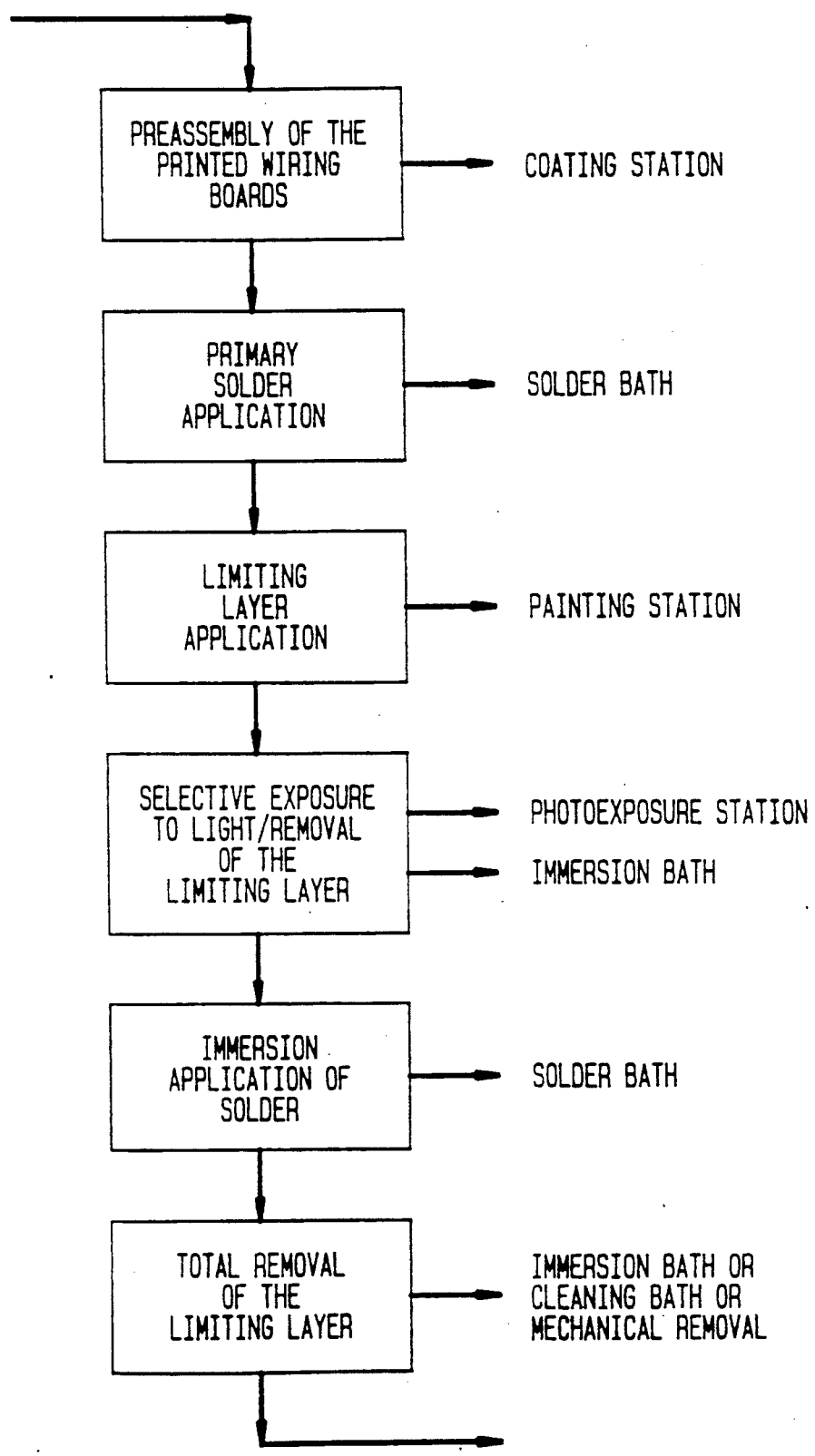
FIG. 8 is a flow chart explaining the essential method steps and the associated stations in terms of apparatus.

FIG. 8, in the form of a flow chart, shows the essence of the method according to the invention at the various associated processing stations.

Figure 10:
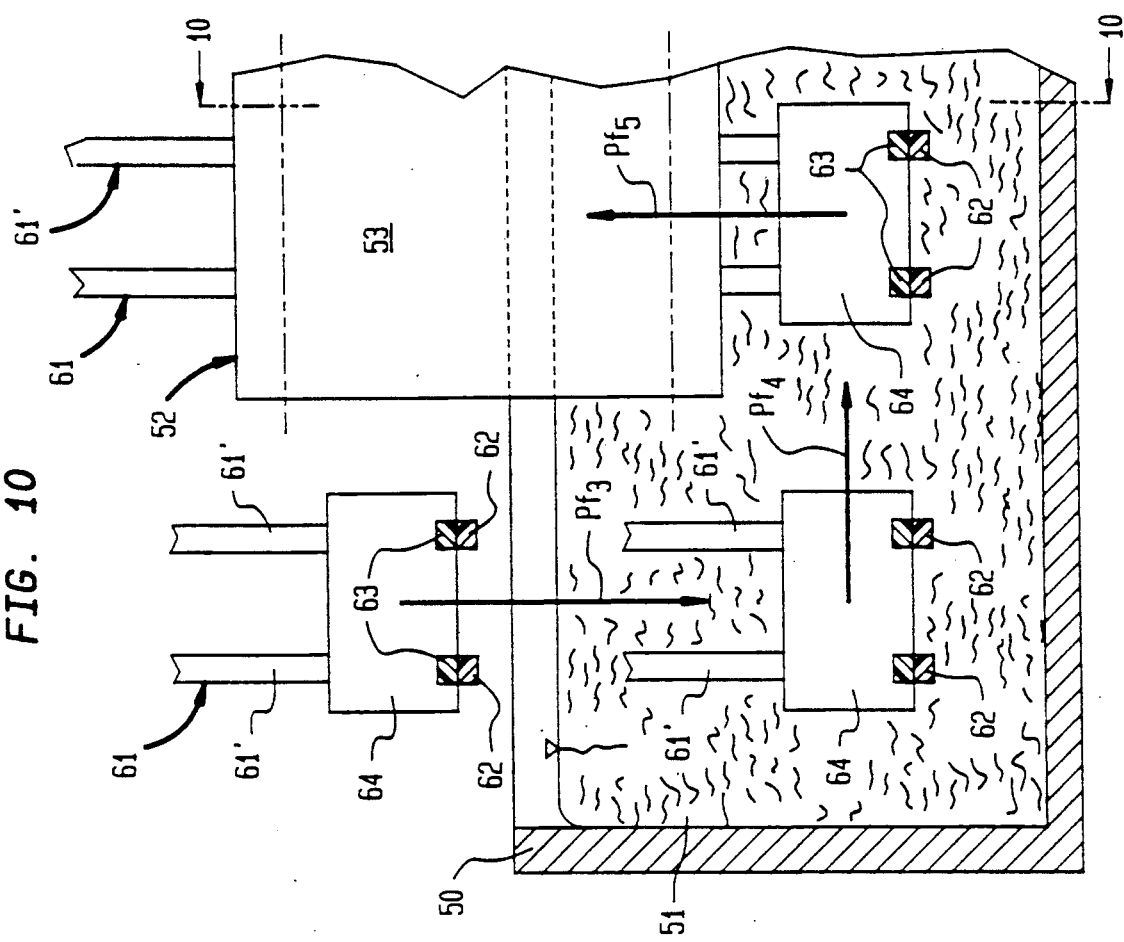
FIGS. 9 and 10 schematically show a further exemplary embodiment of an apparatus for the immersion application of solder to printed wiring boards, the covering device in this case comprising two conveyor belts dipping partway into the solder bath, with FIG. 9 being substantially a sectional view taken along the line 10—10 of FIG. 10.
Figure 9:
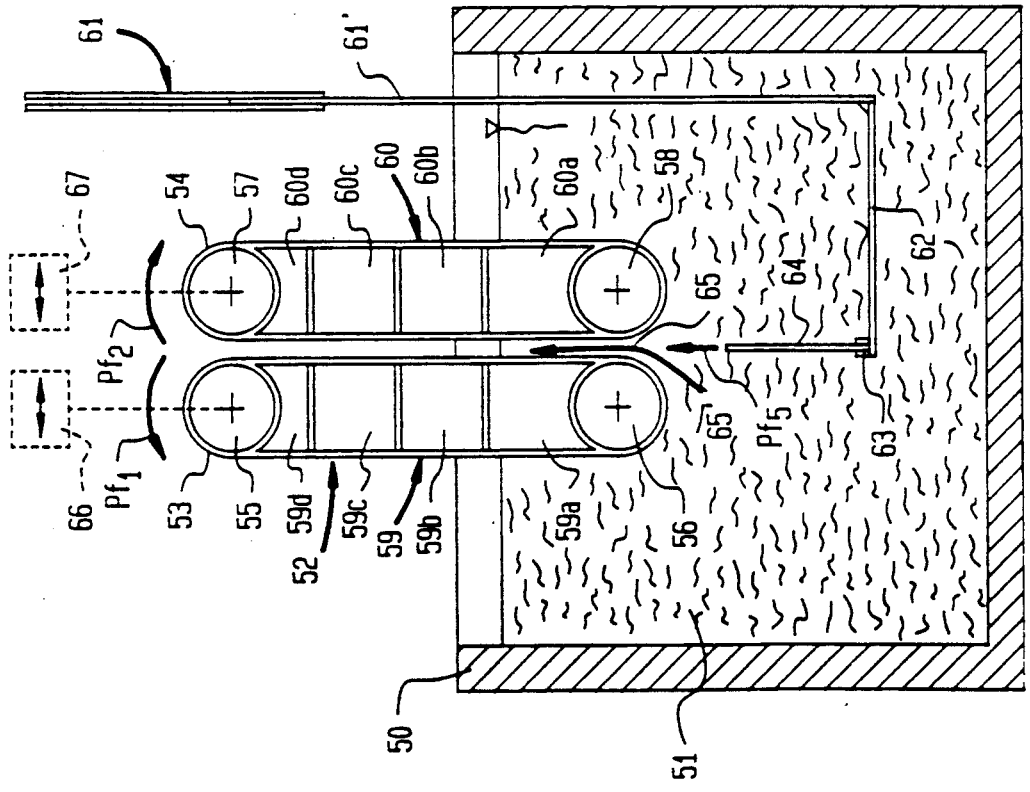

In the exemplary embodiment schematically shown in FIGS. 9 and 10 of an apparatus for the immersion application of solder to printed wiring boards, a solder container 50 is again provided with a liquid solder bath 51 located in it. In this case, the covering device is embodied as a conveyor belt system 52, which has a first conveyor belt 53 and a second conveyor belt 54. The first conveyor belt 53 is guided over first and second rollers 55 and 56, while the second conveyor belt 54 is guided over third and fourth rollers 57 and 58; drive systems, not shown in detail, are provided for driving these guide rollers. By means of these drive systems, the two first and second conveyor belts 53 and 54, which are oriented parallel to one another, are set into contrary but synchronized revolving motion; in FIG. 9, the revolving motion of the first conveyor belt 53 is indicated by an arrow $Pf_1$, while the contrary revolving motion of the second conveyor belt 54 is represented by an arrow $Pf_2$.

A first conveyor belt housing 59 is also provided for the first conveyor belt 53, and a second conveyor belt housing 60 is provided for the second conveyor belt 54. These first and second conveyor belt housings 59 and 60 are disposed such that they are located practically directly adjacent to the respective inside faces or undersides of the first and second conveyor belts 53 and 54, and thus practically support these undersides of the belts.

The first and second conveyor belt housings 59 and 60 also, with their respective upper and lower end-face regions, adjoin the respective conveyor belt guide and deflection rollers; that is, the first conveyor belt housing 59 adjoins the first (upper) roller 55 and the second (lower) roller 56, and the second conveyor belt housing 60 adjoins the third (upper) roller 57 and the fourth (lower) roller 58.

The entire conveyor belt system 52 is also disposed in such a way with respect to the solder container 50 that it dips partway into the solder bath 51; that is, in the present exemplary embodiment, a lower portion of the conveyor belt system, which includes the respective lower deflection and guide rollers for both conveyor belts, is immersed into the solder bath. The conveyor belt system 52 may optionally be moved up and down vertically relative to the solder container 50.

As also shown in FIGS. 9 and 10, a retaining device 61 is also provided for the attachment of a printed wiring board 64 prepared for immersion solder application. This retaining device 61 has substantially two vertically aligned arms 61', to the lower end of each of which support plates 62 bent substantially at a right angle are attached, which plates in turn have receiving devices 63 that serve to support the printed wiring board 64 substantially vertically from below. A material not wettable by solder is particularly used to produce the retaining device 61.

In the exemplary embodiment of FIG. 10, the retaining device 61 together with the printed wiring board 64 are still located above the surface of the solder in the solder bath 51 and laterally offset with respect to the conveyor belt system 52, before the beginning of the process of immersion application of solder.

When the process of immersion application of solder is performed, this retaining device 61 together with the printed wiring board 64 is then lowered vertically downward and as a result is immersed into the solder bath 51 in the direction of an arrow $Pf_3$.

Next, with the aid of the retaining device 61, the printed wiring board 64 is moved through the solder bath 51, until finally the printed wiring board 64 can be introduced from below in the direction of an arrow $Pf_5$ into an entry region 65 between the first and second conveyor belts 53 and 54, as shown in FIG. 9. This entry region 65 then changes into a receiving gap 65' for the printed wiring board 64; this receiving gap is embodied between the first and second conveyor belts 53 and 54 contacting one another.

The width of the receiving gap 65' can preferably be varied, for instance, as schematically suggested in FIG. 9 by dashed lines, by coupling the first conveyor belt housing 59 to a first displacement device 66 and coupling the second conveyor belt housing 60 to a second displacement device 67, while at the same time these two first and second conveyor belt housings 59 and 60 are supported such that they are movable in the horizontal direction. With the aid of the first and second displacement devices 66 and 67, horizontally oriented displacement motions of the first and second conveyor belt housings 59 and 60 can therefore be effected, as indicated by the respective arrows; as a result, the width of the receiving gap 65' between the two surfaces facing one another of the first and second conveyor belts 53 and 54 can be adjusted virtually arbitrarily.

Further options in terms of the variability of the receiving gap 65' are for only one of the two first and second conveyor belt housings 59 and 60 to be movable with the aid of a displacement device, while the other conveyor belt housing is stationary; alternatively, the two first and second conveyor belt housings 59 and 60 may be resiliently supported with respect to the solder container 50, to attain mutual horizontally oriented displacement motions. The printed wiring board 64 introduced in the further course of the process of immersion application of solder into the receiving gap 65' with the aid of the retaining device 61 is transported upward out of the solder bath 51, with the printed wiring board 64 resting with a defined contact pressure against the surfaces of the first and second revolving conveyor belts 53 and 54.

The guidance and motion of the printed wiring board through the solder bath 51 is effected while avoiding any transverse motion relative to the surface of the printed wiring board. In particular, care is taken that the printed wiring board 64 is delivered inside the solder bath 51 to the entry region 65 along a path of motion represented by an arrow $Pf_4$ (see FIG. 10) extending substantially parallel to the surface of the printed wiring board, as a result of which any unfavorable influence on the printed wiring board in the course of its motion through the solder bath 51 is avoided.

The first and second conveyor belts 53 and 54 are preferably metal belts of special steel, titanium or similar materials, which have high flexibility and low thermal conduction and which in particular are provided with an elastic coating on their outsides. Both the conveyor belt base materials and the coatings provided for them must be made of some solder-repelling material, to prevent soldering together, in the course of the immersion solder application process, of the surfaces of the conveyor belts 53 and 54 and of the printed wiring board 64.

As FIG. 9 also shows, housing zones 59a–59d or 60a–60d of different temperatures are embodied in each of the two first and second conveyor belt housings 59 and 60, respectively. The first and second conveyor belts 53 and 54 dip into the solder bath 51 in common with the respective associated lower housing zones 59a and 60a; in this immersion region, a solder bath temperature of approximately 250° C. typically prevails. Directly above the surface of the solder in the solder bath, then housing zones 59b and 60b that are no longer heated but instead are preferably cooled follow; farther upward in the vertical direction are further housing zones 59c and 60c, and finally, housing zones 59d and 60d.

For the various housing zones protruding out of the solder bath 51, that is, the upper housing zones 59b–59d of the first conveyor belt housing 59 and the housing zones 60b–60d of the second conveyor belt housing 60, integrated cooling devices are preferably provided, which are accommodated in the upper region of the conveyor belt system 52 in the respective conveyor belt housings and which assure a direct heat exchange.

Thus the printed wiring board located in the receiving gap 65' between the two first and second conveyor belts 53 and 54 is guided successive zones of different temperature, that is, from a lower zone still located in the solder bath 51 upward in the direction of the cooled zones; one complete conveyor path for the printed wiring board is defined by these zones, corresponding to the housing zones 59a–59d and 60a–60d.

By means of purposeful cooling of the zones that correspond to the portion of the printed wiring board conveyor path located above the surface of the solder in the bath, quenching and hence setting of the solder alloy in the voids located above the regions to which solder is to be applied are effected.

A quenching and setting effect of this kind is metallurgically necessary and advantageous for the following reasons.

The resultant application of solder to the printed wiring board has two intermediate phases or intermetallic zones, between the copper surface and the tin-lead solder deposit, which comprise $Cu_3Sn$ and $Cu_6Sn_5$ and form in the course of the solder application operation, as a result of the chemical processes occurring then. The attempt is made to keep such brittle intermetallic zones as thin as possible, because if the intermediate zone should penetrate to the surface of the tin-lead layer, the printed wiring board would be solderable only with difficulty.

The growth of such intermetallic intermediate zones is dependent on the temperature and the time of the immersion solder application process. If the dwell time in the solder bath is shortened, then relatively thin intermediate zones or layers are attainable. Moreover, an excessive growth of intermetallic intermediate zones would greatly worsen the ductility of the resultant tin layer.

In view of this situation, the attempt is made not only to provide a relatively short dwell time of the printed wiring board and the solder bath, but also to cool down or quench the printed wiring board relatively quickly after its removal from the solder bath; in this process, as shown at the top of FIG. 9, the printed wiring board 64 is therefore guided through the zones of various temperature until it is inside the cooled zones.

After that, the printed wiring board 64, with the solder application finished, is ejected into an output region, which is not shown in detail in FIGS. 9 and 10 for the sake of simplicity.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

What is claimed is:

1. A method for the immersion application of solder to printed wiring boards, comprising the steps of:
   a) providing a printed wiring board with electrically conductive regions, which are to be provided with a solder deposit;
   b) surrounding said regions with a limiting layer of defined layer thickness for preventing an application of solder, which thickness substantially corresponds to the height of the solder deposit to be produced thus forming voids;
   c) immersing the thus-prepared printing wiring board into a soldering bath containing a suitable soldering alloy;
   d) covering the voids, filled in the soldering bath with liquid solder and located above the regions to which solder is to be applied, with at least one closure element at a defined contact pressure;
   e) removing the covered printed wiring board from the soldering bath;
   f) dropping the temperature of the solder trapped in the voids below the setting temperature of the solder alloy;
   g) removing the closure element; and
   h) optionally, removing the limiting layer.

2. A method as defined by claim 1, wherein the limiting layer is embodied by a photosensitive solder resist mask or by a regionally applicable foil layer.

3. A method as defined by claim 1, wherein the limiting layer has a layer thickness of approximately 10 $\mu$m–700 $\mu$m, and preferably 50 $\mu$m–300 $\mu$m.

4. A method as defined by claim 1, wherein the step of optionally removing the limiting layer comprises the step of mechanically detaching the limiting layer from the surface of the printed wiring board or chemically dissolving the limiting layer.

5. A method as defined by claim, wherein the regions to which solder is to be applied are SMD soldering pads of the board, and the step of removing the limiting layer is effected after exposure of the SMD soldering pads by means of a photographic master defining the SMD soldering pads.

6. A method as defined by claim 5, further comprising the step of applying flux to the SMD soldering pads prior to the step of immersing the printed wiring board.

7. A method as defined by claim 1, further comprising the step of applying a primary application of solder by molten metallurgical means to all the regions to be soldered on the printing wiring board, said regions including lands, plated through holes, and SMD pads.

8. A method as defined by claim 5, wherein only the SMD soldering pads are not covered by the limiting layer.

9. A method as defined by claim 1, further comprising the step of generating additional turbulence such that the solder material flows toward the surface of the printed wiring board, particularly upon immersion into the molten soldering bath.

10. A method as defined by claim, wherein the closure element covers the voids located above the regions with elastic pressure.

11. A method as defined by claim 10, wherein the closure element has a closure surface that effects sealing and/or is not wettable by the solder.

12. A method as defined by claim 11, wherein the closure element has a deformably embodied closure surface which, upon being pressed against the surface of the printed wiring board, is pressed inward, at least in some regions, into the voids located above the regions to which solder is to be applied.

13. A method as defined by claim 1, wherein the step of removing the printed wiring board from the soldering bath includes the step of moving the wiring board between two moving revolving elements, at least one of which has a closure surface and serves as the closure element.

14. A method as defined by claim 13, further comprising the step of guiding the printed wiring board between the two revolving elements through successive zones of different temperatures, wherein these zones define a printed wiring board conveyor path, by which means a quenching of the solder alloy in the voids that are located above the regions to which solder is to be applied is effected.

15. A method as defined by claim 14, further comprising heating the lowermost zone being immersed in the soldering bath and cooling at least one zone, which is preferably disposed at the end of the printed wiring board conveyor path.

16. A method as defined by claim 13, further comprising the steps of:
   mounting the printed wiring board with a side edge in an approximately vertical position on a gripper arm;
   immersing the gripper arm provided with the printed wiring board into the soldering bath;
   delivering the printed wiring board to an introduction region, which is embodied by the revolving elements embodied as conveyor belts substantially contacting one another;
   receiving the printed wiring board by the conveyor belts and removal from the gripper arm;
   transporting the printed wiring board in between the two conveyor belts at a defined contact pressure;
   passing the printed wiring board through the zones of different temperature to into the cooling zone; and
   ejecting the printed wiring board, with solder completely applied, to a plate discharge region.

17. A method as defined by claim 16, further comprising the step of delivering the board within the soldering bath to the entry region along a path of motion extending substantially parallel to the surface of the printed wiring board.

* * * * *